(12) United States Patent
Yang et al.

(10) Patent No.: US 10,756,193 B2
(45) Date of Patent: Aug. 25, 2020

(54) GATE DRIVER INTEGRATED CIRCUIT

(71) Applicant: Ningbo Semiconductor International Corporation, Ningbo (CN)

(72) Inventors: Weicheng Yang, Ningbo (CN); Xuhong Yao, Ningbo (CN)

(73) Assignee: Ningbo Semiconductor International Corporation, Ningbo (CN)

( * ) Notice: Subject to any disclaimer, the term of this patent is extended or adjusted under 35 U.S.C. 154(b) by 0 days.

(21) Appl. No.: 16/236,965

(22) Filed: Dec. 31, 2018

(65) Prior Publication Data

US 2020/0195248 A1    Jun. 18, 2020

Related U.S. Application Data

(63) Continuation of application No. PCT/CN2018/122254, filed on Dec. 20, 2018.

(30) Foreign Application Priority Data

Dec. 13, 2018 (CN) .......................... 2018 1 1527590

(51) Int. Cl.
*H01L 29/423* (2006.01)
*H03K 17/687* (2006.01)
*H03K 17/06* (2006.01)
*H01L 29/06* (2006.01)
(Continued)

(52) U.S. Cl.
CPC ...... *H01L 29/42356* (2013.01); *H01L 29/063* (2013.01); *H01L 29/0856* (2013.01); *H01L 29/0865* (2013.01); *H01L 29/0873* (2013.01); *H01L 29/0882* (2013.01);
(Continued)

(58) Field of Classification Search
CPC ............ H01L 29/7823; H01L 29/7835; H01L 29/402; H01L 29/404; H01L 29/0865; H01L 29/0882; H01L 29/42356; H01L 29/66659; H01L 29/78624; H01L 29/41725; H01L 29/41775; H01L 29/063–0634
See application file for complete search history.

(56) References Cited

U.S. PATENT DOCUMENTS 4,757,362 A * 7/1988 Biwa .................... H01L 29/1045
257/336
2009/0273026 A1* 11/2009 Wilson ................ H01L 29/0847
257/330
(Continued)

*Primary Examiner* — Scott B Geyer
(74) *Attorney, Agent, or Firm* — Anova Law Group, PLLC

(57) ABSTRACT

A gate driver integrated circuit is provided. The gate driver integrated circuit includes a substrate having a drift region of a first doping type therein, and a field effect transistor including a drain region of the first doping type, a source region of the first doping type, and a gate structure. The gate driver integrated circuit also includes a first well region of a second doping type and a first contact region of the second doping type. Each of the first well region and the drain region is formed in the drift region, the source region is formed in the first well region, and an end portion of the gate structure near the source region covers a portion of the first well region. Further, the gate driver integrated circuit includes a field plate structure formed on the substrate and disposed between the source region and the drain region.

20 Claims, 2 Drawing Sheets

(51) Int. Cl.
*H01L 29/08* (2006.01)
*H01L 29/40* (2006.01)
(52) U.S. Cl.
CPC ......... *H01L 29/402* (2013.01); *H03K 17/063* (2013.01); *H03K 17/6871* (2013.01)

(56) References Cited

U.S. PATENT DOCUMENTS

| | | | | |
|---|---|---|---|---|
| 2012/0175679 A1* | 7/2012 | Marino | ................ | H01L 29/402 257/194 |
| 2013/0277741 A1* | 10/2013 | Guowei | ................ | H01L 29/402 257/343 |
| 2014/0217466 A1* | 8/2014 | Yamaji | ................ | H01L 29/7816 257/140 |
| 2014/0264583 A1* | 9/2014 | Yamaji | ................ | H01L 29/7816 257/339 |
| 2017/0194489 A1* | 7/2017 | Park | ................... | H01L 29/7823 |

* cited by examiner

GATE DRIVER INTEGRATED CIRCUIT

CROSS-REFERENCES TO RELATED APPLICATIONS

This application is a continuation application of PCT Patent Application No. PCT/CN2018/122254, filed on Dec. 20, 2018, which claims priority to Chinese patent applications No. 201811527590.8, filed on Dec. 13, 2018, the entirety of all of which is incorporated herein by reference.

FIELD OF THE DISCLOSURE

The present disclosure generally relates to the field of semiconductor technology and, more particularly, relates to a high-voltage gate driver integrated circuit.

BACKGROUND

A high-voltage gate driver integrated circuit is a product of a combination of power electronic device technology and microelectronic technology, and is a key component of mechatronics. The high-voltage gate driver integrated circuit is widely used in many applications, e.g., an electronic ballast, a motor driver, dimmer, and various power components, etc.

The high-voltage gate driver integrated circuit often includes a high-voltage-side driver control component, a low-voltage-side driver control component, and a level-shift component. The low-voltage-side driver control component operates under a normal voltage as a control signal part. The high-voltage-side driver control component mainly includes a high-voltage control signal part. The level-shift component is used to transmit a low-voltage-side control signal to the high-voltage-side driver control component. Therefore, to implement such functions, the gate driver integrated circuit usually desires high withstand voltage performance.

In addition, an existing gate driver integrated circuit is usually provided with a plurality of signal ports for leading to components of the gate driver integrated circuit, e.g., a source region, a drain region, a gate structure, a first well region, and a field plate structure, etc. Accordingly, a large number of signal ports are required for these components of the gate driver integrated circuit and must be integrated into the gate driver integrated circuit. Consequently, the gate driver integrated circuit often has tedious designs.

The disclosed gate driver integrated circuit is directed to solve one or more problems set forth above and other problems in the art.

BRIEF SUMMARY OF THE DISCLOSURE

One aspect of the present disclosure provides a gate driver integrated circuit. The gate driver integrated circuit includes a substrate having a drift region of a first doping type therein. The drift region is extended from a surface of the substrate into an inside of the substrate. The gate driver integrated circuit also includes a field effect transistor including a drain region of the first doping type, a source region of the first doping type, and a gate structure. The gate structure is formed on the surface of the substrate and is disposed on a side of the source region away from the drain region. In addition, the gate driver integrated circuit includes a first well region of a second doping type. Each of the first well region and the drain region is formed in the drift region, the source region is formed in the first well region, and an end portion of the gate structure near the source region covers a portion of the first well region. Moreover, the gate driver integrated circuit includes a first contact region of the second doping type. The first contact region is formed in the first well region. Further, the gate driver integrated circuit includes a field plate structure formed on the substrate and disposed between the source region and the drain region. The first contact region is disposed between the source region and the field plate structure.

Other aspects of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. However, those skilled in the art may easily understand that the present disclosure may be implemented without one or more of these details. In certain examples, some well-known technical features in the art are not described herein to avoid confusion with the present disclosure.

Figure 1:
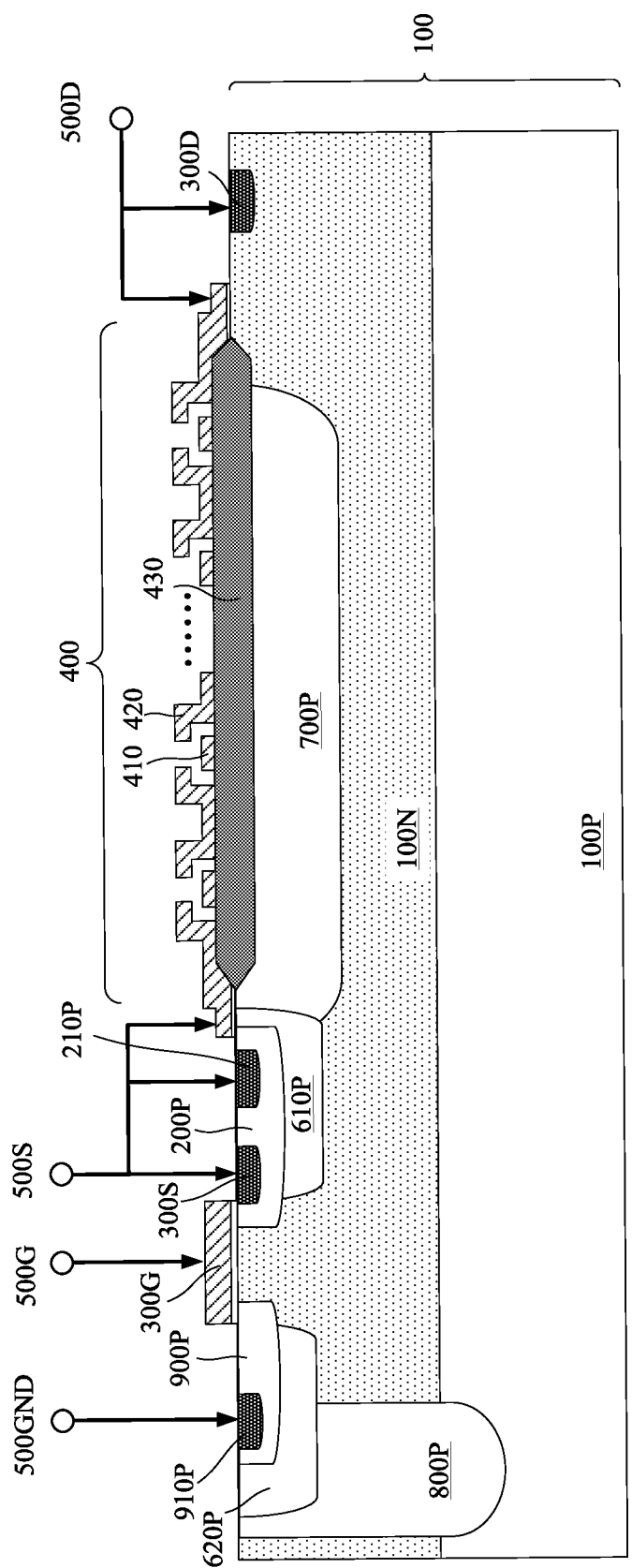
FIG. 1 illustrates a schematic diagram of a high-voltage gate driver integrated circuit consistent with various disclosed embodiments of the present disclosure.

FIG. 1 illustrates a schematic diagram of a high-voltage gate driver integrated circuit consistent with various disclosed embodiments of the present disclosure. Referring to FIG. 1, the gate driver integrated circuit may include a substrate 100. A drift region 100N of a first doping type may be formed in the substrate 100. The drift region 100N may be extended from a surface of the substrate 100 into the inside of the substrate 100.

The gate driver integrated circuit may also include a field effect transistor. The field effect transistor may include a drain region 300D of the first doping type, a source region 300S of the first doping type, and a gate structure 300G. The gate structure 300G may be formed on the surface of the substrate and may be disposed on a side of the source region 300S away from the drain region 300D.

In addition, the gate driver integrated circuit may include a first well region 200P of a second doping type. The first well region 200P and the drain region 300D each may be formed in the drift region 100N. The source region 300S may be formed in the first well region 200P. An end portion of the gate structure 300G near the source region 300S may cover a portion of the first well region 200P.

Moreover, the gate driver integrated circuit may include a first contact region 210P of the second doping type. The first contact region 210P may be formed in the first well region 200P. The first contact region 210P may be electrically connected to the first well region 200P having a same doping type as the first contact region 210P. When a voltage is applied to the first contact region 210P, the first well region 200P may have a corresponding voltage value.

Further, the gate driver integrated circuit may include a field plate structure 400. The field plate structure 400 may be formed on the substrate 100 and may be disposed between the source region 300S and the drain region 300D. The first contact region 210P may be disposed between the source region 300S and the field plate structure 400.

In the disclosed gate driver integrated circuit, when a turn-on voltage is applied to the gate structure 300G of the field effect transistor, the portion of the first well region 200P covered by the gate structure 300G may be inverted to form a conductive channel, and, thus, current may flow from the source region 300S via the conductive channel and the drift region 100N to the drain region 300D. Further, when a high voltage is applied to the drain of the field effect transistor, a reverse voltage may be applied to a PN junction formed in the drift region 100N and formed by connecting with the drift region, and, thus, a depletion layer of the PN junction may be extended to withstand the high voltage, and the high-voltage region and the low-voltage region may be pinched off to turn off the field effect transistor.

Moreover, the source region 300S, the first contact region 210P, and the field plate structure 400 may be sequentially disposed, and, thus, the source region 300S, the first contact region 210P, and the field plate structure 400 may be proximately disposed, which may facilitate to proximately dispose three signal lines respectively connecting to the source region 300S, the first contact region 210P, and the field plate structure 400. Therefore, the three signal lines respectively connecting to the source region 300S, the first contact region 210P, and the field plate structure 400 each may be connected to a same signal port.

Therefore, not only a quantity of the signal ports of the gate driver integrated circuit may be effectively reduced to simplify the circuit design of the gate driver integrated circuit, but also the layout size of the gate driver integrated circuit may be correspondingly reduced to adapt to the device size tending to be reduced.

The first doping type may be a doping type opposite to the second doping type. In one embodiment, the first doping type may be an N-type, and the second doping type may be a P-type. In another embodiment, the first doping type may be a P-type, and the second doping type may be an N-type. The disclosed embodiments are explained using the first doping type being an N-type and the second doping type being a P-type as an example.

Further, an ion doping concentration of the first contact region 210P may be greater than an ion doping concentration of the first well region 200P, and the first contact region 210P may be used to electrically connect to the first well region 200P. Based on a fact that the ion doping concentration of the first contact region 210P is greater than the ion doping concentration of the first well region 200P, a reduction of a contact resistance between a signal line for connecting to the first contact region and the first contact region 210P may be facilitated.

Referring to FIG. 1, in one embodiment, the substrate 100 may include a base substrate 100P of the second doping type and an epitaxial layer of the first doping type formed on the base substrate 100P. The epitaxial layer of the first doping type may be the drift region 100N. In one embodiment, a doping type of the base substrate 100P may be a P-type, and a resistivity of the base substrate 100P may be in a range of approximately 50 ohm·cm-100 ohm·cm.

Figure 2:
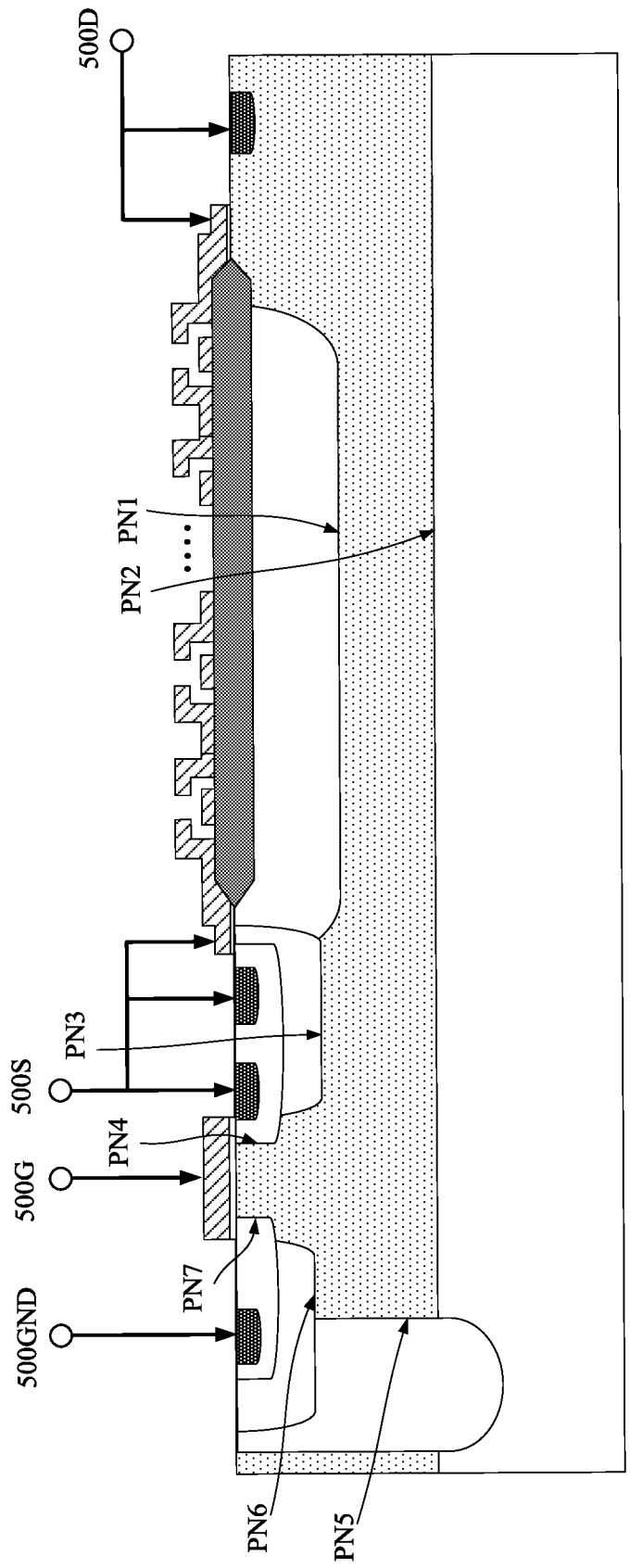
FIG. 2 illustrates a schematic diagram of a distribution of PN junctions of a high-voltage gate driver integrated circuit consistent with various disclosed embodiments of the present disclosure.

FIG. 2 illustrates a schematic diagram of a distribution of PN junctions of the high-voltage gate driver integrated circuit consistent with various disclosed embodiments of the present disclosure. Referring to FIG. 2, in one embodiment, because the base substrate 100P has a doping type opposite to the drift region 100N, the base substrate 100P and the drift region 100N may form a PN junction (second PN junction PN2). When the gate driver integrated circuit is under a high-voltage condition, a depletion layer of the PN junction may be extended to increase an area of the depletion layer in the drift region, thereby improving the withstand high-voltage performance of the gate driver integrated circuit.

In one embodiment, the epitaxial layer may be a single-layer epitaxial layer. Further, the single-layer epitaxial layer may be N-type doped to form the drift region 100N. The N-type doping may include, e.g., a phosphorus doping, a resistivity of the doped single-layer epitaxial layer may be in a range of approximately 2.5 ohm·cm-3.5 ohm·cm, and a thickness of the single-layer epitaxial layer may be in a range of approximately 15 μm-22 μm. Therefore, the formed gate driver integrated circuit may have a substantially large withstand voltage performance (e.g., withstanding a high voltage in a range of approximately 200 V-700 V).

In certain embodiments, the epitaxial layer may be formed by a double-layer epitaxial layer, and the double-layer epitaxial layer may include a bottom epitaxial layer and a top epitaxial layer formed on the bottom epitaxial layer. The bottom epitaxial layer and the top epitaxial layer of the double-layer epitaxial layer may have different doping concentrations. In one embodiment, a resistivity of the bottom epitaxial layer may be lower than a resistivity of the top epitaxial layer. In other words, an ion doping concentration of the bottom epitaxial layer may be substantially high, and, thus, the resistivity of the bottom epitaxial layer may be substantially low. Therefore, when a high voltage is applied to the gate driver integrated circuit, the bottom epitaxial layer having the high doping concentration may facilitate to implement the depletion process of the PN junction formed by the base substrate and the bottom epitaxial layer, and may be used to meet the withstand high-voltage demands of the gate driver integrated circuit.

In one embodiment, a thickness of the bottom epitaxial layer may be in a range of approximately 3 μm-5 μm, and a resistivity of the bottom epitaxial layer may be in a range of approximately 0.5 ohm·cm-1.5 ohm·cm. A thickness of the top epitaxial layer may be in a range of approximately 6 μm-11 μm, and a resistivity of the top epitaxial layer may be in a range of approximately 2.5 ohm·cm-3.5 ohm·cm.

Accordingly, because the double-layer epitaxial layer is capable of independently adjusting the doping concentration of the bottom epitaxial layer and the doping concentration of the top epitaxial layer, on the basis of ensuring the conduction performance of the field effect transistor, with respect to the single-layer epitaxial layer, the double-layer epitaxial layer may implement the withstand high-voltage performance of the gate driver integrated circuit at a substantially smaller thickness, which may facilitate to reduce the device size. However, on the other hand, with respect to the double-layer epitaxial layer, the single-layer epitaxial layer may desire to perform one epitaxial process, and the process may be substantially simple.

Referring to FIG. 1, the gate driver integrated circuit in the disclosed embodiments may include the field plate structure 400. With respect to the gate driver integrated circuit without the field plate structure, by providing the field plate structure 400, two ends of the field plate structure 400 may desire to be electrically connected to the source region and the drain region respectively when in use. In this case, when a high voltage is applied to the drain region, a voltage distribution between the drain region and the source region may be gradually reduced from the drain region via the field plate structure to the source region. The electric field in a substrate region under the field plate structure may be dispersed to avoid high voltage aggregation near the drain region. In other words, in the disclosed embodiments, by providing the field plate structure 400, the strong electric field in the high voltage region may be dispersed away from the high voltage region using the field plate structure 400, thereby avoiding the strong electric field aggregation in the high voltage region. In one embodiment, when a high voltage is applied to the drain region 300D, because the electric field can be further dispersed from the drain region 300D toward a direction away from the drain region, the phenomenon of electric field aggregation in the drain region 300D may be effectively avoided, and, thus, the drain region 300D may be prevented from being penetrated.

In one embodiment, the field plate structure 400 may be a multi-layer field plate structure. In one embodiment, the field plate structure 400 may include N bottom conductive layers 410, a capacitive dielectric layer (not illustrated) covering a sidewall and a top of each bottom conductive layer 410, and N+1 upper conductive layers 420, where N is a positive integer greater than or equal to 1. The N bottom conductive layers 410 may be sequentially spaced from the drain region 300D to the source region 300S. Each upper conductive layer 420 may be formed on the capacitive dielectric layer. The first upper conductive layer and the N+1$^{th}$ upper conductive layer at the end of the N+1 upper conductive layers 420 may cover the first bottom conductive layer and the N$^{th}$ bottom conductive layer, respectively. Two ends of each upper conductive layer 420 disposed between the first upper conductive layer and the N+1$^{th}$ upper conductive layer may cover adjacent bottom conductive layers 410, respectively.

In other words, the two ends of each upper conductive layer 420 disposed between the first upper conductive layer and the N+1$^{th}$ upper conductive layer and the covered two bottom conductive layers 410 may form two adjacent coupling capacitors, and the two adjacent coupling capacitors may be electrically connected by a upper conductive layer 420. Further, the N bottom conductive layers 410 and the N+1 upper conductive layers 420 may correspondingly form N+1 coupling capacitors, respectively. The N+1 coupling capacitors may be sequentially disposed along a direction from the drain region 300D to the source region 300S.

When a high voltage is applied to an end of the field plate structure 400 near the drain region 300D and a low voltage is applied to another end of the field plate structure 400 near the source region 300S, correspondingly, the end of the field plate structure 400 near the drain region 300D may present as a high voltage, and the end of the field plate structure 400 near the source region 300S may present as a low voltage. From the first coupling capacitor closest to the drain region 300D to the N+1$^{th}$ coupling capacitor closest to the source region 300S, a coupling voltage of the coupling capacitor may be gradually reduced. Therefore, a voltage of the field plate structure 400 may sequentially decrease along a direction from the drain region 300D to the source region 300S, and correspondingly, an electric field intensity in the substrate region under the field plate structure 400 may sequentially decrease along a direction from the drain region 300D to the source region 300S.

The bottom conductive layer 410 and the upper conductive layer 420 of the field plate structure each may have a ring shape. In one embodiment, the N annular bottom conductive layers 410 may be disposed in concentric circles centered on the drain region 300D, and the N+1 annular upper conductive layers 420 may be correspondingly disposed in concentric circles centered on the drain region 300D and may cover the bottom conductive layers 410. In other words, the field plate structure 400 may have a ring structure, the drain region 300D may be disposed at a center location of the field plate structure 400, and the source region 300S may be disposed outside of the field plate structure 400.

In certain embodiments, the field plate structure may be a single-layer field plate structure. In one embodiment, the field plate structure may have a continuously extended conductive layer that extends in a direction from the drain region 300D to the source region 300S. In this case, when a high voltage is applied to the end of the field plate structure near the drain region and a low voltage is applied to the end of the field plate structure near the source region, that is, when under the resistance divider of the continuously extended conductive layer, the voltage of the conductive layer may be gradually reduced from the end near the drain region to the end near the source region. In one embodiment, the continuously extended conductive layer in the field plate structure may be spirally extended in a direction away from the drain region 300D centered on the drain region 300D, and, thus, the conductive layer may present a spiral structure.

In another embodiment, the single-layer field plate structure may further include a plurality of mutually separated conductive layers. The plurality of conductive layers may be disposed in a same structural layer and may be sequentially disposed in the direction from the drain region to the source region in a single layer. In this case, a first conductive layer closest to the drain region may be coupled to an adjacent second conductive layer to form a first coupling capacitor, and the second conductive layer may be further coupled to an adjacent third conductive layer to form a second coupling capacitor. Accordingly, a conductive layer may be sequentially coupled to a following adjacent conductive layer to form a coupling capacitor until an M$^{th}$ coupling capacitor is formed along a direction away from the drain region. When a voltage is applied to the field plate structure, a coupling voltage of the coupling capacitor may be gradually reduced from the first coupling capacitor to the M$^{th}$ coupling capacitor. Similarly, the plurality of mutually separated conductive layers each may have a ring shape, and may be disposed in concentric circles centered on the drain region 300D. In view of this, the field plate structure of the ring structure may be correspondingly formed. The drain region 300D may be disposed at a central location of the field plate structure 400, and the source region 300S may be disposed outside of the field plate structure 400.

Referring to FIG. 1, the gate driver integrated circuit may further include a plurality of signal lines. The plurality of signal lines may include a first signal line for connecting the source region 300S, a second signal line for connecting the drain region 300D, a third signal line for connecting the first contact region 210P, and a fourth signal line and a fifth signal line for connecting the field plate structure 400. The fourth signal line may be connected to the end of the field plate structure 400 near the source region 300S, and the fifth signal line may be connected to the end of the field plate structure 400 near the drain region 300D.

The signal lines for connecting the source region 300S, the first contact region 210P, and the field plate structure 400 may be connected to a same signal port. In one embodiment, the first signal line of the source region 300S, the third signal line of the first contact region 210P, and the fourth signal line of the field plate structure 400 may be connected to a source signal port 500S.

Further, the fifth signal line of the field plate structure 400 and the second signal line of the drain region 300D may be connected to a same signal port. In one embodiment, the fifth signal line of the field plate structure 400 and the second signal line of the drain region 300D each may be connected to a drain signal port 500D. When a high voltage is applied to the drain signal port 500D, a signal voltage of the drain signal port 500D may be often greater than a signal voltage of the source signal port 500S.

In one embodiment, when a high voltage is applied to the drain signal port 500D, correspondingly, a high voltage may be applied to the end of the field plate structure 400 near the drain region and the drain region 300D. When a low voltage is applied to the source signal port 500S, correspondingly, a low voltage may be applied to the end of the field plate structure 400 near the source region, the source region 300S, and the first contact region 210P.

In one embodiment, the first signal line of the source region 300S and the third signal line of the first contact region 210P each may be connected to a same signal port, and, thus, the source region 300S and the first well region 200P may be maintained at a same voltage value. In one embodiment, a PN junction may be formed between the source region 300S of the first doping type and the first well region 200P of the second doping type. When the voltage applied on the PN junction exhibits a forward voltage, a leakage current between the first well region 200P and the source region 300S may occur. In view of this, in the disclosed embodiments, the first well region 200P may have a same voltage as the source region 300S to prevent the PN junction formed by the first well region 200P and the source region 300S from having the forward voltage, thereby avoiding the leakage current phenomenon.

Moreover, when a high voltage is applied to the drain signal port 500D, because the signal voltage of the drain signal port 500D is often greater than the signal voltage of the source signal port 500S, the end of the field plate structure 400 near the drain region may still have a high voltage, and the end of the field plate structure 400 near the source region may still have a low voltage. Therefore, under the electric field modulation of the field plate structure 400, the electric field strength in the substrate region may sequentially decrease from the drain region 300D toward a direction away from the drain region 300D.

In addition, the plurality of signal lines may include a gate signal line for connecting the gate structure 300G. The gate signal line may be further connected to a gate signal port 500G. A gate signal may be inputted through the gate signal port 500G to control the turn-on or turn-off of the field effect transistor.

Referring to FIG. 1, the gate driver integrated circuit may further include a field oxide layer 430. The field oxide layer 430 may be partially embedded into the substrate 100 and may be disposed between the source region 300S and the drain region 300D. In one embodiment, the field oxide layer 430 may be formed by a local oxidation of silicon (LOCOS) process. When the substrate 100 is a silicon substrate, correspondingly, the field oxide layer 430 may be a silicon oxide layer.

The field plate structure 400 may be at least partially formed on the field oxide layer 430. In one embodiment, the two ends of the field plate structure 400 may be extended from the field oxide layer 430 to the surface of the substrate, respectively. In one embodiment, the end of the field plate structure 400 near the source region 300S and the end of the field plate structure 400 near the drain region 300D each may be extended from the field oxide layer 430 to the surface of the substrate. A portion of the field plate structure 400 extended to the surface of the substrate may serve as an electrical connection part, and the signal line for connecting the field plate structure may be disposed on the electrical connection part.

Further, the gate driver integrated circuit may further include a reduced surface field (RESURF) region 700P of the second doping type formed in the drift region 100N. The reduced surface field region 700P may be formed in a region corresponding to the substrate under the field plate structure 400. In one embodiment, the reduced surface field region 700P may also be formed under the field oxide layer 430.

In one embodiment, a doping type of the reduced surface field region 700P may be a P-type, which may be formed by doping with boron ions. A length of the reduced surface field region 700P from the drain region 300D to the source region 300S may be in a range of approximately 30 µm-80 µm.

Referring to FIG. 1, the first well region 200P may be further extended to the reduced surface field region 700P in a direction facing toward the drain region, and, thus, the first well region 200P may be connected to the reduced surface field region 700P. In one embodiment, the first well region 200P may be partially overlapped with the reduced surface field region 700P, and, thus, the first well region 200P and the reduced surface field region 700P may be connected to each other. Therefore, when a high voltage or a low voltage is applied to the first well region 200P through the first contact region 210P, the reduced surface field region 700P may correspondingly have a high voltage or a low voltage.

Referring to FIG. 2, the field plate structure 400 may be disposed over the reduced surface field region 700P. Therefore, when a high voltage is applied to the drain region 300D, a high voltage is applied to the end of the field plate structure 400 near the drain region, and a low voltage is applied to the end of the field plate structure 400 near the source region, the electric field strength in the substrate region may be decreasingly distributed from the drain region 300D to the source region 300S. On the one hand, an upper portion of the reduced surface field region 700P near an upper surface may be inverted to form the first doping type (e.g., N-type). Therefore, under the barrier of the inversion layer, the high voltage may be prevented from being applied to the surface of the substrate to improve the issue that the surface of the substrate is prone to be broken down. On the other hand, the reduced surface field region 700P may have a low voltage through the first contact region 210P, which may be equivalent to applying a reverse voltage to a first PN junction PN1 formed by the reduced surface field region 700P and the drift region 100N. The first PN junction PN1 may deplete a lower portion of the reduced surface field region 700P under the action of the reverse voltage for withstanding a high voltage.

Further, the substrate 100 in the disclosed embodiments may have the base 100P of the second doping type, and the base substrate 100P of the second doping type may be disposed under the drift region 100N and may border the drift region 100N. Therefore, a second PN junction PN2 may be formed between the base substrate 100P and the drift region 100N. When a high voltage is applied to the drain region, the first PN junction PN1 and the second PN junction PN2 each may undergo depletion layer expansion to further increase an area of the depletion layer formed in the drift region 100N.

In one embodiment, the first PN junction PN1 may be formed over the second PN junction PN2, and the formed depletion layer corresponding to the first PN junction PN1 and the formed depletion layer corresponding to the second PN junction PN2 may be extended in the drift region 100N toward each other. In other words, the depletion layer corresponding to the first PN junction PN1 may be extended in the drift region 100N in a direction toward the second PN junction PN2, and the depletion layer corresponding to the second PN junction PN2 may be extended in the drift region 100N in a direction toward the first PN junction PN1. Therefore, the depletion layer corresponding to the second PN junction PN2 and the depletion layer corresponding to the first PN junction PN1 may pass through each other. Thus, an area of the depletion layer may increase, and based on the depletion layers that pass through each other, which may be equivalent to that the source region 300S and the drain region 300D are pinched off between the source region 300S and the drain region 300D, a high-voltage region corresponding to the drain region and a low-voltage region corresponding to the source region may be isolated from each other, thereby achieving the purpose of isolating the high voltage. Therefore, the gate driver integrated circuit may be effectively prevented from being broken down, and the withstand voltage performance of the device may greatly increase.

Referring to FIG. 1, the gate driver integrated circuit may further include a first deep junction region 610P of the second doping type formed in the drift region 100N. The first deep junction region 610P may be disposed under the first well region 200P and may be connected to the first well region 200P. The first deep junction region 610P may be used to increase a depth of a junction corresponding to a location of the first well region. In one embodiment, the first deep junction region 610P may have a P-type doping type, and may be formed by being doped with boron ions. Further, an ion doping concentration of the first deep junction region 610P may be greater than the ion doping concentration of the first well region 200P.

As the depth of the junction corresponding to the location of the first well region increases, the interface of the PN junction corresponding to the location of the first well region may be extended into a deeper location of the substrate. In one embodiment, when the first deep junction region is not disposed, the depth of the junction corresponding to the location of the first well region may be a bottom boundary of the PN junction formed by the first well region 200P and the drift region 100N. When the first deep junction region 610P is disposed, the depth of the junction corresponding to the location of the first well region may be a bottom boundary of the PN junction formed by the first deep junction region 610P and the drift region 100N. In other words, by disposing the first deep junction region 610P, the depth of the junction formed by the first well region 200P and the drift region 100N may be further lowered from the bottom location of the first well region 200P to the bottom location of the first deep junction region 610P.

Referring to FIG. 2, because a depletion layer corresponding to a third PN junction PN3 can be extended to a substantially deep location in the substrate, the depletion layer corresponding to the third PN junction PN3 may substantially easily pass through the depletion layer corresponding to the second PN junction PN2, and, thus, the device may be capable of withstanding substantially high voltage.

Moreover, an interface of the PN junction corresponding to the location of the first well region may be extended toward a substantially deep location in the substrate, and accordingly, a surface area of the PN junction (i.e., a sum of a surface area of the third PN junction PN3 and a surface area of a fourth PN junction PN4) may increase. Thus, the depletion layer of a substantially large area may be extended, which may in turn improve the withstand voltage performance of the first well region. Therefore, under the protection of the first deep junction region 610P, the first well region 200P may be protected from being broken down.

The first well region 200P may form a part of the field effect transistor. Thus, the improvement of the withstand voltage performance of the first well region 200P may facilitate to improve the anti-breakdown performance of the corresponding field effect transistor.

In addition, the above-described first deep junction region 610P may be disposed under the first well region 200P, thus, with respect to the first well region 200P, the first deep junction region 610P may be extended in a deeper location in the substrate. The first deep junction region 610P may not only be disposed directly under the first well region 200P, but also be further extended in a width direction. In one embodiment, the first deep junction region 610 near a side boundary of the reduced surface field region 700P may be further extended to the reduced surface field region 700P. In this case, when the device is subjected to a high voltage, the depletion layer corresponding to the first PN junction PN1 and the depletion layer corresponding to the third PN junction PN3 may pass through each other, and, thus, the breakdown voltage of the PN junction may increase.

In another embodiment, the first deep junction region 610P away from the side boundary of the reduced surface field region may not be extended to a region under the gate structure 300G. Correspondingly, the portion of the first well region 200P covered by the gate structure 300G may not overlap with the first deep junction region 610P. In one embodiment, the portion of the first well region 200P covered by the gate structure 300G may be extended from the first deep junction region 610P to form a channel region. Because the first deep junction region 610P does not overlap with the channel region in the first well region 200P, the channel region of the first well region 200P may be prevented from being affected by the first deep junction region 610P. In certain embodiments, the side boundary of the first deep junction region 610P away from the reduced surface field region may cover the side boundary of the first well region 200P away from the reduced surface field region.

In addition, the portion of the first well region 200P covered by the gate structure may be extended from the first deep junction region 610P, and, thus, a bordered portion of the first well region 200P and the drift region 100N may form the fourth PN junction PN4. In this case, the depletion layer corresponding to the fourth PN junction PN4 and the depletion layer corresponding to the third PN junction PN3 may pass through each other, which may facilitate to improve the breakdown voltage of the fourth PN junction PN4, and may prevent the PN junction between the first well region 200P and the drift region 100N from being broken down before pinching off the high voltage.

Referring to FIG. 1, the gate driver integrated circuit may further include an isolation region 800P of the second doping type formed in the substrate 100. The isolation region 800P may penetrate through the epitaxial layer to extend into the base substrate 100P. In other words, the isolation region 800P may penetrate through the drift region 100N. A substrate region surrounded by the isolation region 800P may be defined as a device region, and the field effect transistor and the field plate structure 400 each may be formed in the device region.

In one embodiment, based on a PN junction isolation technique of the isolation region 800P, a high-voltage isolation of the gate driver integrated circuit from other devices may be implemented. Further, in one embodiment, the isolation region 800P may have a ring structure. The isolation region 800P may have a ring structure, and, thus, the device region surrounded by the isolation region may have, e.g., a circle-shape, an ellipse-shape, or a square-shape, etc. In one embodiment, a circular device region may be surrounded by the isolation region 800P, and the field effect transistor and the field plate structure, etc., may be surrounded in the device region.

Referring to FIG. 2, the isolation region 800P of the second doping type and the drift region 100N of the first doping type may form a fifth PN junction PN5. The fifth PN junction PN5 may be capable of being depleted. The isolation region 800P in the disclosed embodiments may not only implement PN junction isolation based on the PN junction, but also be used to further increase the area of the depletion layer based on the PN junction, thereby further improving the anti-breakdown performance of the device.

In one embodiment, the gate driver integrated circuit may further include a second deep junction region 620P of the second doping type formed in the substrate 100. The second deep junction region 620P may be partially formed in the isolation region 800P and may be extended into the device region in a direction toward the field plate structure 400 to connect the isolation region 800P and the drift region 100N. An ion doping concentration of the second deep junction region 620P may be smaller than an ion doping concentration of the isolation region 800P.

In one embodiment, in a high-voltage device, to achieve desired isolation performance, the isolation region 800P may often be formed by a heavily doped region. However, too large ion concentration may easily cause the isolation region 800P to be prone to be broken down due to electric field concentration at an interface (in particular, a corner connecting the top boundary of the isolation region 800P and the surface of the substrate) adjacent to the drift region 100N. In view of this, the second deep junction region 620P of a substantially low doping concentration may be disposed to buffer the concentration difference between the isolation region 800P and the drift region 100N. The second deep junction region 620P may be disposed at a junction of the isolation region 800P and drift region 100N to cover at least a portion of the interface between the isolation region 800P and the drift region 100N, thereby effectively improving the interface breakdown issue. In one embodiment, the second deep junction region 620P may be disposed at the corner connecting the top boundary of the isolation region 800P and the surface of the substrate.

Further, the gate driver integrated circuit may further include a second well region 900P of the second doping type formed in the substrate 100. The second well region 900P may be partially formed in the second deep junction region 620P, and may be extended out of the second deep junction region 620P in a direction approaching the first well region 200P.

In one embodiment, the second deep junction region 620P may partially overlap with the second well region 900P. With respect to the second well region 900P, the second deep junction region 620P may be extended into a deeper location in the substrate 100. In this case, a depth of a junction corresponding to the second well region may increase, and a breakdown voltage of the second well region may increase. Therefore, the second well region 900P may be protected from being broken down before isolating the high voltage.

In one embodiment, the first well region 200P and the second well region 900P may be formed in a same ion implantation process, and accordingly, the first well region 200P and the second well region 900P may have a same diffusion depth in the substrate 100. The first deep junction region 610P and the second deep junction region 620 may be simultaneously formed in a same ion implantation process, and accordingly, the first deep junction region 610P and the second deep junction region 620P may have a same diffusion depth. The first deep junction region 610P may be extended to a region under the first well region 200P, and the second deep junction region 620P may be extended to a region under the second well region 900P.

Referring to FIGS. 1-2, the second deep junction region 620P may be partially formed in the isolation region 800P and may be partially extended into the drift region 100N to connect the isolation region 800P and the drift region 100N. Therefore, a bordered portion of the second deep junction region 620P and the drift region 100N may form a sixth PN junction PN6. A depletion layer corresponding to the sixth PN junction PN6 and the depletion layer corresponding to the fifth PN junction PN5 may pass through each other.

In one embodiment, the second well region 900P may be extended from the second deep junction region 620P in a direction approaching the first well region 200P, and may be further extended into a region under the gate structure 300G. In other words, a side boundary of the second well region 900P and a side boundary of the first well region 200P that face each other may be covered by the two ends of the gate structure 300G, respectively. In other words, the end of the gate structure 300G near the source region may partially cover the first well region 200P, and the end of the gate structure away from the source region may partially cover the second well region 900P. Accordingly, a dimension of a spacing between the second well region 900P and the first well regions 200P may be smaller than a dimension of a width of the gate structure 300G. Therefore, the spacing between the second well region 900P and the first well region 200P may be substantially small.

Referring to FIG. 2, a bordered portion of the second well region 900P and the drift region 100N may form a seventh PN junction PN7. Because the spacing between the second well region 900P and the first well region 200P is substantially small, correspondingly, the seventh PN junction PN7 and the fourth PN junction PN4 may be proximately disposed. Therefore, a depletion layer corresponding to the seventh PN junction PN7 and the depletion layer corresponding to the fourth PN junction PN4 may pass through each other, and, thus, a breakdown voltage of the seventh PN junction PN7 and a breakdown voltage the fourth PN junction PN4 each may be improved.

Referring to FIG. 1, a second contact region 910P of the second doping type may be further formed in the second well region 900P. The second doping region 910P may have an ion doping concentration greater than the second well region 900P. The signal input or output of the second well region 900P at a low contact resistance may be implemented by disposing the second contact region 910P.

Further, the plurality of signal lines may further include an isolation signal line for connecting the second contact region 910P. The isolation signal line may be further connected to an isolation signal port 500GND. In one embodiment, the isolation signal port 500GND may be grounded. In one embodiment, the isolation region 800P, the second deep junction region 620P, and the second well region 900P may partially overlap with each other, and may be electrically connected to each other. Therefore, when the isolation signal port 500GND is grounded, the isolation region 800P, the second deep junction region 620P, and the second well region 900P each may have a ground voltage.

In the gate driver integrated circuit in the disclosed embodiments, by sequentially disposing the source region 300S, the first contact region 210P, and the field plate structure 400, the fourth signal line of the field plate structure 400 near the source region 300S may be connected to the source signal port 500S, and the third signal line of the first contact region may be connected to the source signal port 500S. In view of this, the quantity of signal ports of the gate driver integrated circuit may be reduced. In one embodiment, the gate driver integrated circuit in the disclosed embodiments may be provided with four signal ports, which may facilitate to simplify the layout design of the circuit and to effectively reduce the device size.

Further, in one embodiment, the first deep junction region may often be formed under the first well region. Thus, the depth of the junction corresponding to the location of the first well region may increase, thereby improving the withstand voltage performance of the junction corresponding to the location of the first well region. Therefore, when a high voltage is applied to the drain region, the depletion layers in the substrate region may pass through each other to prevent the first well region from being broken down before pinching off the isolation high voltage. In view of this, the gate driver integrated circuit may be capable of withstanding a substantially high voltage (e.g., a voltage above 600 V).

Further, in one embodiment, the gate driver integrated circuit may be a level shift circuit. The level shift circuit may be used to transmit a low-voltage control signal of the control circuit to a high-voltage driver circuit. Therefore, the level shift circuit may often desire to be connected to the high-voltage driver circuit. Because the level shift circuit in the disclosed embodiments has substantially high withstand voltage performance, the level shift circuit may be prevented from being broken down at a high voltage. Moreover, the layout design of the level shift circuit may be simplified, which may facilitate to reduce the size of the level shift circuit.

In the gate driver integrated circuit in the disclosed embodiments, by sequentially disposing the source region, the first contact region, and the field plate structure, the source region, the first contact region, and the field plate structure may be proximately disposed, and, thus, the signal line of the source region, the signal line of the first contact region, and the signal line of the field plate structure may be connected to a same signal port. Therefore, a quantity of the signal ports of the gate driver integrated circuit may be effectively reduced, which may facilitate to simplify the circuit design of the gate driver integrated circuit and to reduce the size of the gate driver integrated circuit.

In one embodiment, the signal line of the source region, the signal line of the first contact region, and the signal line of the field plate structure near the source region each may be connected to the source signal port. The signal line of the drain region and the signal line of the field plate structure near the drain region each may be connected to the drain signal port. In this case, the source region and the first well region may be maintained at a same voltage value, and, thus, the leakage current from the source region to the first well region in the conduction process of the field effect transistor may be avoided. On the other hand, when a high voltage (the high voltage may be in a range of approximately 200 V-700 V) is applied to the source signal port, the voltage value of the drain signal port may often be greater than the voltage value of the source signal port, and accordingly, the end of the field plate structure near the drain region may have a high voltage, and the end of the field plate structure near the source region may have a low voltage. In other words, the voltage of the field plate structure may be gradually reduced from the drain region to the source region. Therefore, not only the electric field modulation may be implemented using the field plate structure to avoid electric field concentration in the drain region, but also the electric field distribution in the substrate region under the field plate structure may be gradually weakened from the drain region to the source region. In other words, in a case where the device is subjected to a high voltage, the voltage difference across the field plate structure may be ensured to implement electric field modulation of the field plate structure.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A gate driver integrated circuit, comprising:
    a substrate having a drift region of a first doping type therein, wherein the drift region is extended from a surface of the substrate into an inside of the substrate;
    a field effect transistor including a drain region of the first doping type, a source region of the first doping type, and a gate structure, wherein the gate structure is formed on the surface of the substrate and is disposed on a side of the source region away from the drain region;
    a first well region of a second doping type, wherein each of the first well region and the drain region is formed in the drift region, the source region is formed in the first well region, and an end portion of the gate structure near the source region covers a portion of the first well region;
    a first contact region of the second doping type, wherein the first contact region is formed in the first well region; and
    a field plate structure, formed on the substrate and disposed between the source region and the drain region, wherein the first contact region is disposed between the source region and the field plate structure.

2. The circuit according to claim 1, further including:
    a plurality of signal lines, including
        a first signal line for connecting the source region,
        a second signal line for connecting the drain region,
        a third signal line for connecting the first contact region, and
        a fourth signal line and a fifth signal line for connecting the field plate structure,
        wherein the fourth signal line is connected to an end of the field plate structure near the source region, and the fifth signal line is connected to another end of the field plate structure near the drain region.

3. The circuit according to claim 2, wherein:
    the first signal line, the third signal line, and the fourth signal line are connected to a same signal port.

4. The circuit according to claim 2, wherein:
    the second signal line and the fifth signal line are connected to a same signal port.

5. The circuit according to claim 1, further including:
a first deep junction region of the second doping type, wherein the first deep junction region is disposed under the first well region and is connected to the first well region.

6. The circuit according to claim 1, further including:
a reduced surface field region of the second doping type, wherein the reduced surface field region is disposed between the gate structure and the drain region, and in the substrate under the field plate structure.

7. The circuit according to claim 6, wherein:
the first well region is further extended to the reduced surface field region to connect to the reduced surface field region, in a direction facing toward the drain region.

8. The circuit according to claim 1, wherein:
the substrate includes a base substrate of the second doping type and an epitaxial layer of the first doping type formed on the base substrate, wherein the epitaxial layer is the drift region.

9. The circuit according to claim 8, wherein:
the epitaxial layer includes a bottom epitaxial layer and a top epitaxial layer formed on the bottom epitaxial layer, wherein the top epitaxial layer has a resistivity greater than the bottom epitaxial layer.

10. The circuit according to claim 9, wherein:
the resistivity of the bottom epitaxial layer is in a range of approximately 0.5 ohm·cm-1.5 ohm·cm, and
the resistivity of the top epitaxial layer is in a range of approximately 2.5 ohm·cm-3.5 ohm·cm.

11. The circuit according to claim 8, wherein:
the epitaxial layer is a single-layer structure, and
a resistivity of the single-layer structure is in a range of approximately 2.5 ohm·cm-3.5 ohm·cm.

12. The circuit according to claim 8, further including:
a ring-shaped isolation region of the second doping type, penetrating through the epitaxial layer to extend into the base substrate, wherein a substrate region surrounded by the isolation region is defined as a device region, and each of the field effect transistor and the field plate structure is formed in the device region.

13. The circuit according to claim 12, further including:
a second deep junction region of the second doping type, wherein the second deep junction region is partially formed in the isolation region and is extended into the device region in a direction toward the field plate structure, and an ion doping concentration of the second deep junction region is smaller than an ion doping concentration of the isolation region.

14. The circuit according to claim 13, further including:
a second well region of the second doping type, wherein the second well region is partially formed in the second deep junction region, and is extended out of the second deep junction region in a direction approaching the first well region.

15. The circuit according to claim 14, wherein:
an end portion of the gate structure away from the source region partially covers the second well region.

16. The circuit according to claim 1, wherein the field plate structure includes:
N bottom conductive layers, wherein the N bottom conductive layers are sequentially spaced apart from the drain region to the source region,
a capacitive dielectric layer, covering a sidewall and a top of each bottom conductive layer, and
N+1 upper conductive layers, wherein each upper conductive layer is formed on the capacitive dielectric layer, a first upper conductive layer and an N+1$^{th}$ upper conductive layer at ends of the N+1 upper conductive layers cover a first bottom conductive layer and an N$^{th}$ bottom conductive layer, respectively, two ends of each upper conductive layer disposed between the first upper conductive layer and the N+1$^{th}$ upper conductive layer covers adjacent bottom conductive layers, respectively, wherein N is a positive integer greater than or equal to 1.

17. The circuit according to claim 1, wherein:
the field plate structure includes a plurality of conductive layers separated from each other, wherein the plurality of conductive layers are disposed in a same structural layer and are sequentially disposed as a single layer in a direction from the drain region to the source region.

18. The circuit according to claim 1, wherein:
the field plate structure has a continuously extended conductive layer, wherein the conductive layer is extended in a direction from the drain region to the source region.

19. The circuit according to claim 1, wherein:
a withstand voltage of the drain region is in a range of approximately 200 V-700 V.

20. The circuit according to claim 1, wherein:
the gate driver integrated circuit is a level shift circuit.

* * * * *